US006663797B2

(12) United States Patent
Bratovski et al.

(10) Patent No.: US 6,663,797 B2
(45) Date of Patent: Dec. 16, 2003

(54) STABILIZATION OF CONFIGURABLE MOLECULAR MECHANICAL DEVICES

(75) Inventors: Alexandre Bratovski, Mountain View, CA (US); Xiao-An Zhang, Sunnyvale, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 540 days.

(21) Appl. No.: 09/738,793

(22) Filed: Dec. 14, 2000

(65) Prior Publication Data

US 2002/0113229 A1 Aug. 22, 2002

(51) Int. Cl.$^7$ .............................. H01B 1/00; H01L 27/00; H01L 51/20; H01L 51/30; G11C 13/02

(52) U.S. Cl. ..................... 252/500; 365/151; 257/14; 257/40; 257/592; 438/800

(58) Field of Search .................. 252/500; 429/122; 200/262, 52 R; 365/151; 257/14, 40, 592; 438/49, 99, 133, 800

(56) References Cited

U.S. PATENT DOCUMENTS

| | | | |
|---|---|---|---|
| 3,833,894 A | | 9/1974 | Aviram et al. |
| 6,198,655 B1 | * | 3/2001 | Heath et al. ............. 365/151 |
| 6,459,095 B1 | * | 10/2002 | Heath et al. ............. 257/14 |

FOREIGN PATENT DOCUMENTS

DE 10013013 A 10/2000

OTHER PUBLICATIONS

Balzani, V et al: "Molecular Machines" 1998, pp. 405–414 Accounts of Chemical Research, American Chemical Society, Washington, US vol. 31 No. 7.

Reed, M et al "Prospects for molecular–scale devices" 1999, IEDM Technical Digest pp. 227–230.

Sentein , C et al. "Study of orientation induced molecular rectification in polymer films"1998, Optical Material, Elsevier Science pp. 316–322.

Tsivgoulis, G M et al; "Photoswitched Sexithiophenes: Towards Switchable Molecular Wires" 1997 Advanced Matherials, VCH pp. 39–42.

Kotera, M et al; "Design and Synthesis of Complementary Components for the Formation of Self–Assembled Supromalecular Rigid Rods" 1995, Tetrahedron, Elsevier Schience Publishers pp. 1953–1972.

Gilat S L et al; "Light–Triggered Electrical and Optical Switching Devices" 1993 Journal of the Chemical Society pp. 1439–1442.

(List continued on next page.)

Primary Examiner—Mark Kopec

(57) ABSTRACT

A route to the fabrication of electronic devices is provided, in which the devices consist of two crossed wires sandwiching an electrically addressable molecular species. The approach is extremely simple and inexpensive to implement, and scales from wire dimensions of several micrometers down to nanometer-scale dimensions. The electronic devices can be used to produce crossbar switch arrays, logic devices, memory devices, and communication and signal routing devices. The construction of molecular electronic devices is achieved on a length scale than can range from micrometers to nanometers via a straightforward and inexpensive chemical assembly procedure. The molecular switchable devices in the cross-bar geometry are configurable while the conformational change is controlled by intramolecular forces that are stronger than hydrogen bonding. The method of the present invention is directed to configuring an ensemble of molecular switches in a prescribed manner in cross-bar geometry and then making such configuration either substantially permanent or stable with respect to temperature fluctuations.

12 Claims, 2 Drawing Sheets

OTHER PUBLICATIONS

Gaidukevich: Polarographic reduction of acridone and its derivatives in dimethylformamide: Abstract Database accession No: 90:86425.

A.M. Morales et al, "A laser ablation method for the synthesis of crystalline semiconductor nanowires", Science, vol. 279, pp. 208–211 (Jan. 9, 1998).

J.R. Heath et al, "A liquid solution synthesis of single crystal germanium quantum wires", Chemical Physics Letters, vol. 208, pp. 263–268 (Jun. 11, 1993).

V.P. Menon et al, "Fabrication and Evaluation of Nano–electrode Ensembles", Analytical Chemistry, vol. 67, pp. 1920–1928 (Jul. 1, 1995).

T. Vossmeyer et al. "Combinatorial approaches toward patterning nanocrystals", Journal of Applied Physics, vol. 84, pp. 3664–3670 (Oct. 1, 1998).

D.V. Leff et al, "Thermodynamic Size Control of Au Nanocrystals: Experiment and Theory", The Journal of Physical Chemistry, vol. 99, pp. 7036–7041 (May 4, 1995).

J.D.L. Holloway et al, "Electron–transfer reactions of metallocenes: Influence of metal oxidation state on structure and reactivity", Journal of the American Chemical Society, vol. 101, pp. 2038–2044 (Apr. 11, 1979).

"Stronger binding through co–operativity", Chemical & Engineering News, p. 57 (May 8, 2000).

* cited by examiner-

STABILIZATION OF CONFIGURABLE MOLECULAR MECHANICAL DEVICES

CROSS-REFERENCE TO RELATED APPLICATIONS

The present application is related to the following applications: Ser. No. 09/282,048 ("Chemically Synthesized and Assembled Electronic Devices") Now U.S. Pat. No. 6,459,095; Ser. No. 09/280,225 ("Molecular Wire Crossbar Interconnects for Signal Routing and Communications") Now U.S. Pat. No. 6,314,019; Ser. No. 09/280,189 ("Molecular Wire Crossbar Memory") Now U.S. Pat. No. 6,128,214; Ser. No. 09/282,045 ("Molecular Wire Crossbar Logic") Now ABN; Ser. No. 09/282,049 ("Demultiplexer for a Molecular Wire Crossbar Network") Now U.S. Pat. No. 6,256,767; and Ser. No. 09/280,188 ("Molecular Wire Transistors"), all filed on Mar. 29, 1999. The present application is an improvement over the foregoing applications in allowing a configuring of arbitrary molecular devices with practically indefinite lifetime (>10 years at room temperature).

TECHNICAL FIELD

The present invention relates generally to electronic devices whose functional length scales are measured in nanometers, and, more particularly, to simple devices used as building blocks to form more complicated structures, and to the methods for forming such devices. Devices both of micrometer and nanometer scale may be constructed in accordance with the teachings herein.

BACKGROUND ART

The silicon (Si) integrated circuit (IC) has dominated electronics and has helped it grow to become one of the world's largest and most critical industries over the past thirty-five years. However, because of a combination of physical and economic reasons, the miniaturization that has accompanied the growth of Si ICs is reaching its limit. The present scale of devices is on the order of tenths of micrometers. New solutions are being proposed to take electronics to ever smaller levels; such current solutions are directed to constructing nanometer-scale devices.

Prior proposed solutions to the problem of constructing nanometer-scale devices have involved (1) the utilization of extremely fine scale lithography using X-rays, electrons, ions, scanning probes, or stamping to define the device components; (2) direct writing of the device components by electrons, ions, or scanning probes; or (3) the direct chemical synthesis and linking of components with covalent bonds. The major problem with (1) is that the wafer on which the devices are built must be aligned to within a small fraction of the size of the device features in at least two dimensions for several successive stages of lithography, followed by etching or deposition to build the devices. This level of control does not scale well as device sizes are reduced to nanometer scale dimensions. It becomes extremely expensive to implement as devices are scaled down to nanometer scale dimensions. The major problem with (2) is that it is a serial process, and direct writing a wafer full of complex devices, each containing trillions of components, could well require many years. Finally, the problem with (3) is that high information content molecules are typically macromolecular structures such as proteins or DNA, and both have extremely complex and, to date, unpredictable secondary and tertiary structures that cause them to twist into helices, fold into sheets, and form other complex 3D structures that will have a significant and usually deleterious effect on their desired electrical properties as well as make interfacing them to the outside world impossible.

Devices of molecular size with switching electric behavior are currently the focus of research world-wide. These devices are viewed as possible replacement to Si-based technologies. In spite of much speculation, however, there are very few experimental results available at this point in time that show some kind of possible switching behavior, the origin of which (intrinsic or extrinsic) is the subject of debate. In previous systems, the switching was either irreversible, or reversibility was achieved on thick molecular films, or switching was volatile.

The above-identified related patent applications are all based on switching of a bi-stable molecule, an example of which is a rotaxane, from one stable state to another stable state by application of an external electric field. Such configuring of the molecular switch by applying an external electric field, which changes the conformation of the molecule and switches it between a low-resistive and a high-resistive state, can be only done on weakly bonded molecular fragments. Usually, it involves the hydrogen bond, where one can overcome the energy barrier of about 0.5 eV (or less). On the one hand, the conformation of stronger bonded molecules is difficult to change, and requires an application of even stronger fields, which in the case of the hydrogen bond are already comparable to atomic fields ($\sim 10^{+8}$ to $10^{+9}$ V/cm), and can easily damage the device. On the other hand, the barrier of 0.5 eV is insufficient for any reasonable application, since the corresponding lifetime is short with respect to thermal fluctuations destroying the given configuration of the switch. The lifetime $\tau$ is estimated according to the formula $$\frac{1}{\tau} = \omega_0 \exp(-U_b/kT)$$

where $\omega_0 \sim 1$ THz is the typical attempt (molecular vibration) frequency, $U_b$ is the energy barrier, k is Boltzmann's constant, and T is the temperature. For the barrier 0.5 eV at room temperature, one estimates the lifetime as $5 \times 10^{-4}$ sec, i.e., extremely short. Thus, one needs much larger barriers (stronger bonds), but they will prevent the device from switching.

There remains a need for a mechanism that permits configuring the molecular switchable devices in the cross-bar geometry while the conformational charge is controlled by weak intramolecular forces (e.g., hydrogen bonding).

DISCLOSURE OF INVENTION

In accordance with the present invention, the molecular switchable devices in the cross-bar geometry are configurable while the conformational change is controlled by intramolecular forces that are stronger than hydrogen bonding. The method of the present invention, which is directed to configuring an ensemble of molecular switches in a prescribed manner in cross-bar geometry and then making such configuration either substantially permanent or stable with regard to temperature fluctuations, comprises the steps of:

providing the ensemble of molecular switches in the cross-bar geometry, each molecular switch comprising a pair of crossed wires that form a junction where one wire crosses another at an angle other than zero degrees;

providing the junction with at least one connector species connecting the pair of crossed wires in the junction, the junction having a functional dimension in the nanometer to micrometer range, wherein at least one connector species and the pair of crossed wires forms an electrochemical cell, the connector species comprising a molecule and having at least one active dipole; and either substantially permanently configuring the connector species where the connector species has one active dipole or stably configuring the connector species where the connector species has more than one active dipole.

There are two approaches that can be taken to achieve the desired configuration. In one approach, the connector species is configured and then an exchange chemical reaction is carried out to make that configuration substantially permanent. The process comprises:

forming the connector species in the junction;

applying an external electric field to the junction to configure the connector species;

replacing a hydrogen atom with a species that forms a bond with a portion of the dipole that is stronger than a hydrogen bond; and removing the electric field, leaving the switch substantially permanently in this configuration.

In this first approach, the switch may remain switchable, though bonded with associative bonds that are stronger than the hydrogen bond, by utilizing associative bonding such as fluorine to nitrogen, nitrogen to oxygen, and divalent metal to oxygen. Alternatively, the switch may be made permanent by utilizing even stronger bonds, such as sulfur to oxygen covalent bonding.

In another approach, the connector species is stabilized in one of two stable states as follows:

providing a plurality of dipole groups on the connector species, each capable of hydrogen bonding with an adjacent dipole group on the connector species;

forming the connector species in the junction;

applying an external electric field to the junction to configure the connector species; and removing the electric field, leaving the switch in the stabilized configuration.

In this second approach, the multiple dipole groups ensure that the switch remains in the state into which it was configured until an opposite polarity electric field is applied to switch it again.

The method of the present invention is very general and allows a configuring of arbitrary molecular devices with practically indefinite lifetime (>10 years at room temperature).

Advantageously, the method of the present invention introduces a method by which the ensemble of molecular switches can be configured in a prescribed way in a cross-bar geometry and then this configuration be made permanent.

The method of the present invention solves the above-noted problem of switching through high energy barriers and allows (i) configuring of the molecular switches and then (ii) making the configured system stable with respect to thermal noise and other external perturbations.

BEST MODES FOR CARRYING OUT THE INVENTION

Definitions

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM).

The term "bi-stable" as applied to a molecule means a molecule having two relatively low energy states separated by an energy (or activation) barrier. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.05 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 1 to 10 micrometers, heights that can range from a few tens of nanometers to a micrometer, and lengths of several micrometers and longer.

Basic Information on Crossed Wire Switches

Figure 1A:
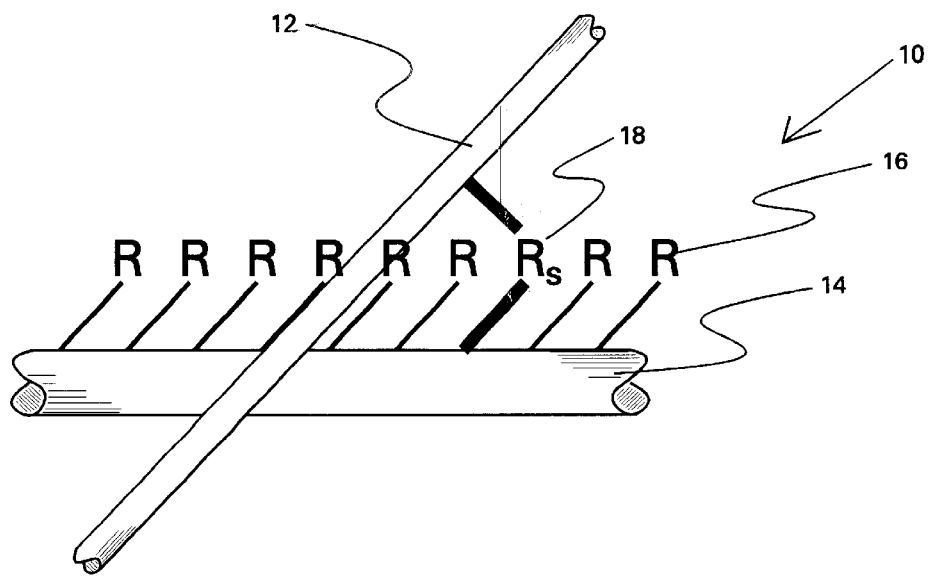
FIG. 1A is a schematic representation of two crossed wires, with at least one molecule at the intersection of the two wires.
Figure 1B:
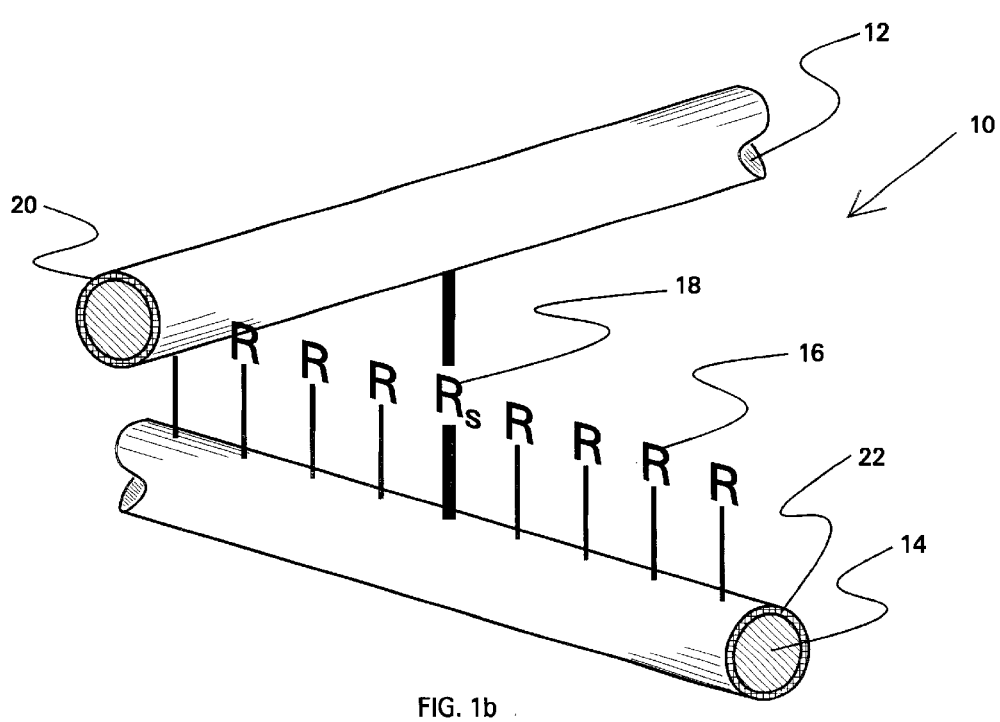
FIG. 1B is a perspective elevational view, depicting the device shown in FIG. 1A.

The essential device features are shown in FIGS. 1A–1B. A crossed wire switch 10 comprises two wires 12, 14, each either a metal or semiconductor wire, that are crossed at some non-zero angle. In between those wires is a layer of molecules or molecular compounds 16, denoted R in FIGS. 1A and 1B. The particular molecules 18 (denoted $R_s$) that are sandwiched at the intersection of the two wires 12, 14 are identified as switch molecules, also interchangeable referred to herein as a junction. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

The electrical tasks performed by these devices are largely determined by the types of wires (electrodes) and the interwire materials that are used. Table I presents the various types of devices that might be fabricated from various combinations of the wires 12, 14 in FIGS 1A–1B.

TABLE I

Wire (Electrode) Materials

| Device Type | Metal-metal (same) | Metal-metal (different) | Metal-semiconductor | Semiconductor-Semiconductor (p-n junction) | Semiconductor-semiconductor (heterojunction) |
|---|---|---|---|---|---|
| Resistor | × | × | × | | |
| Tunneling resistor | × | × | × | | |
| Resonant tunneling resistor | × | × | × | | |
| Diode | | × | × | × | × |
| Tunneling diode | | × | × | × | × |
| Resonant tunneling diode | | × | × | × | × |
| Battery | | × | × | | × |

Depending on the molecules or materials that are used between the wires (the electrodes), each junction can either display the types of electrical function described below immediately on contact of the wires or the junction can have a switching function that acts to connect or disconnect the two wires together electrically. This switch can either be singly configurable or reconfigurable. In the first case, the initial state of the switch is open or closed. Electrically biasing the switch beyond a particular threshold voltage that is determined by the materials in the junction, which is essentially an electrochemical cell, oxidizes or reduces the material or molecules between the wires to irreversibly close or open the switch, respectively, thus permanently reversing its initial state. In the second case, by cycling the polarity and magnitude of the voltage on the switch beyond the appropriate threshold values, it is possible to reversibly oxidize or reduce the properly selected materials or molecules to close or open the switch many times. In either case, when closed, the type of electrical connection that is made between the wires depends upon the materials from which the wires (or electrodes) are fabricated as well as the identity of the molecules or materials between the wires.

Table I above shows a matrix of the various types of functions that can be obtained from various combinations of electrode materials and materials or molecules used in the junction. A resistor has a linear current-voltage characteristic, and is made by intentionally over-reducing the junction between various types of wires to essentially form a short circuit between the wires. The opposite of this process is to over-oxidize a junction, which will consume the wire in a localized region and effectively break the wire (create an open circuit) in that wire at the position of the junction. A tunneling resistor maintains a thin, approximately 2 nanometer thick, insulating barrier between wires and has an exponential current-voltage characteristic. In the case that junction molecules or materials have a sharply defined energy state inside the band gap of an electrically insulating barrier that can be accessed by electrically biasing the junction, the connection between the wires can exhibit a flow of electrical current that is dominated by the process of resonant tunneling. The resonant tunneling can produce one or more inflection points in the otherwise exponential current-voltage characteristic of a tunneling resistor. A diode is a junction that passes current more easily in one direction than in the other, and thus has an asymmetry in the current-voltage characteristic for positive and negative voltages. A tunneling diode has both the positive-negative voltage asymmetry of the diode and the exponential current-voltage characteristic of the tunneling resistor. A resonant tunneling diode has a positive-negative voltage asymmetry plus it has a peak in its current-voltage characteristic, such that over a restricted range of increasing magnitude of the voltage the magnitude of the current actually decreases, a phenomenon that is known as negative differential resistivity. Finally, a battery is a circuit element that acts to hold a constant voltage difference between its electrodes as long as the battery is sufficiently charged, e.g., there is a sufficient supply of oxidizing and reducing agents separated by an insulating barrier. Charging the battery is accomplished by placing the appropriate voltage across the junction, which as stated before is an electrochemical cell, to only partially oxidize or reduce the material or molecules in the junction. In general, any real junction between wires formed by the processes described above will actually have two or more of the electrical functions described, with the effective circuit elements connected in series.

Thus, the present invention may be executed with any number of metallic or semiconducting wire/molecule combinations, depending on the device properties desired from the assembled circuit.

Basic Information on Fabrication of Wire Electrodes

Process-Defined Wires (defined as wires that are prepared by conventional electronic-circuit processing techniques; wires are typically prepared on a substrate as part of a circuit):

Metallic and semiconductor wires, with diameters ranging from several micrometers to a single micrometer (defined as micrometer-scale), or with diameters ranging from a single micrometer down to 40 nanometers (defined as sub-micrometer scale) in diameter, may be prepared using well-established art, including lithographic (optical, ultraviolet, or electron beam) technologies. These wires normally have a ribbon shape or rectangular cross section, although circular cross sections are not precluded, with the width of the wire being determined by the lithographic process used to define the wire and its height being defined by the amount of material deposited in the region defined by lithography.

Chemically-Prepared Wires (these wires are prepared by techniques other than conventional electronic processing technology; wires are typically prepared as a bulk material, rather than as part of a circuit board):

Metal and semiconductor nanowires are defined as wires with diameters below 50 nanometers (typically 2 to 20 nanometers), and with lengths in the range of 0.1 micrometers to 50 micrometers (typically 5 to 10 micrometers). These may be prepared chemically using any one of a number of techniques described in the references given below.

One example of a reported technique for the production of semiconductor nanowires of the semiconducting element germanium is to react germanium tetrachloride and phenyltrichlorogermanium with a dispersion of sodium metal in the solvent toluene, and at a temperature near 300° C. in a closed vessel, under an inert environment, for a period of several days. That preparation produces single-crystal germanium nanowires of diameters three to thirty nanometers, and of lengths from 0.5 to 10 micrometers.

A second example of a reported technique for the production of semiconductor nanowires of the semiconducting element silicon, is to laser vaporize a target containing elemental silicon and iron. The target is placed in a vacuum oven at 1300° C., and an inert gas is flowed through the oven during the vaporization process. This technique produces silicon wires that have diameters in the range of 20 to 30 nanometers, and lengths ranging from 1 to 20 micrometers.

One example of a reported technique for the production of metallic nanowires of the metallic element gold is to electrochemically grow gold wires within the pores of an anodically etched aluminum oxide thin film. The aluminum oxide is dissolved in acidic solution, releasing the gold nanowires, which are then collected. Gold nanowires grown in this manner are characterized by diameters ranging from 20 to 30 nanometers, and lengths ranging from 0.5 to 5 micrometers.

Nanowires of various metallic and semiconducting materials may be prepared in a variety of fashions that are discussed in greater detail in related application Ser. No. 09/280,048. Some of these devices will require doped semiconductor wires, such as doped Si.

For the case of Si wires, the wires can be doped when the wires are physically prepared. In this case, it is necessary to add the dopant into the reaction vessel as the wires are formed. For example, in the laser ablation/vacuum oven preparation technique described above, a small amount of dopant gas, such as phosphorus trihydride ($PH_3$) or arsenic trihydride ($AsH_3$) is added into the inert gas (argon, for example) that flows through the vacuum oven during the laser ablation/wire formation process.

Conversely, these wires can be modulation-doped by coating their surfaces with appropriate molecules—either electron-withdrawing groups (Lewis acids, such as boron trifluoride ($BF_3$)) or electron-donating groups (Lewis bases, such as alkyl-amines) to make them p-type or n-type conductors, respectively. See wire preparation routes listed below. FIG. 1B depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed. Or yet alternatively, the wires 12, 14 may be coated with molecular species 20, 22, respectively, for example, that enable one or both wires to be suspended to form colloidal suspensions, as discussed below.

To dope the wires via modulation-doping, it is necessary to chemically functionalize the surface of the wires using organic or inorganic molecules that will covalently bind to the Si—O—H groups at the surface of the wires. When silicon nanowires are exposed to air, a thin surface layer (1 $\mu$m) of $SiO_2$ will naturally form, and at the $SiO_2$/air interface, the $SiO_2$ surface is terminated by Si—O—H bonds. Groups that will bind to or replace Si—O—H groups are not limited to but include R—$Si(CH_3)_x(OCH_{3-x})$, R—$Si(CH_3)_x(OCH_2CH_{3-x})$, R—$Si(CH_3)_xCl_{3-x}$, and others. In this case, R represents an organic or inorganic moiety that can contain electron-withdrawing (a Lewis acid) or electron-donating groups (a Lewis base). This chemistry of binding molecules to a $SiO_2$ passivated silicon surface is well established. One published example reaction for binding molecules to the surface of $SiO_2$ passivated silicon is:

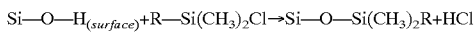

$$Si—O—H_{(surface)}+R—Si(CH_3)_2Cl \rightarrow Si—O—Si(CH_3)_2R+HCl$$

Other semiconductor wires can be functionalized with organo-amines, organo-thiols, organo-phosphates, etc.

Apparently, no previous description of how to modulation-dope chemically synthesized semiconductor wires has yet appeared in the technical literature.

For the case of other nanowires, such as metal nanowires, the wires can be chemically functionalized with R—SH (for gold or silver wires), or R—$NH_2$ (for platinum wires and palladium wires), or R—$CO_2H$ for other metals such as $Al_2O_3$-coated aluminum wires or titanium wires), where the R-group denotes some organic moiety that will lend the wire certain chemical properties—such as the property that will allow the person skilled in the art to disperse the wires, as a colloid, in a solvent. In one example, gold wires might be functionalized with dodecanethiol ($C_{12}H_{25}SH$). The dodecanethiol not only will provide the wires with a thin surface tunneling barrier, but will also allow for the wires to be dispersed in simple organic solvents, such as hexane or chloroform.

Basic Information on Wire Preparation Routes

The following materials may be prepared as nanowires according to the reference listed.

Silicon: A. M. Morales et al, "A laser ablation method for the synthesis of crystalline semiconductor nanowires", *Science*, Vol. 279, pp. 208–211 (Jan. 9, 1998).

Germanium: J. R. Heath et al, "A liquid solution synthesis of single crystal germanium quantum wires", *Chemical Physics Letters*, Vol. 208, pp. 263–268 (Jun. 11, 1993).

Metal Nanowires: V. P. Menon et al, "Fabrication and Evaluation of Nanoelectrode Ensembles", *Analytical Chemistry*, Vol. 67, pp. 1920–1928 (Jul. 1, 1995).

Functionalizing Silicon: T. Vossmeyer et al, "Combinatorial approaches toward patterning nanocrystals", *Journal of Applied Physics*, Vol. 84, pp. 3664–3670 (Oct. 1, 1998) (one of a number of references).

Functionalizing the Surfaces of Gold Nanostructures: D. V. Leff et al, "Thermodynamic Size Control of Au Nanocrystals: Experiment and Theory", *The Journal of Physical Chemistry*, Vol. 99, p. 7036–7041 (May 4, 1995).

Molecular switching components may come from any number of different classes of molecules, depending, again, on the desired properties of the device. The key requirement of the molecules is that, when they are sandwiched between two wires, they may be electrochemically modified (i.e. oxidized or reduced) by applying a voltage across the wires. When the molecular components are so modified, the net effect is that the tunneling barrier between the two wires is modified, and the rate of current flow is changed. This forms the basis of a switch that can, in turn, be used for memory, logic operations, and communication and signal routing networks. Molecular switches can include redox pairs of molecules, in which application of a voltage reduces one of the molecules and oxidizes the other. An example of such a molecular redox pair might be: nickelocene (di-cyclopentadienyl nickel), or $Cp_2Ni$, with tetrabutylammonium hexafluorophosphate ($Bu_4NPF_6$). The reaction, then, would be:

(reduction) $Cp_2Ni+Bu_4NPF_6 \rightarrow Cp_2Ni^- + Bu_4NP_6^+$     (−1.7 V)

or (oxidation) $Cp_2Ni+Bu_4NPF_6 \rightarrow Cp_2Ni^+ + Bu_4NPF_6^-$     (−0.1 V)

The nickelocene system is of particular interest in that the reduction, as probed by solution phase cyclic voltammetry, is highly asymmetric. Such asymmetry is analogous to magnetization hysteresis curves that form the basis for stable and re-writeable magnetic memory. However, in the presence of oxygen, the reduction of nickelocene is irreversible, as probed by solution phase voltammetry. In either case, reduction or oxidation of this system will modify the tunneling barrier between the two wires between which the molecules are sandwiched. Thus, this system could operate as either a reconfigurable, or a singly configurable molecular switch. For metallocene systems, see, e.g., J. D. L. Holloway et al, "Electron-transfer reactions of metallocenes: Influence of metal oxidation state on structure and reactivity", *Journal of the American Chemical Society*, Vol. 101, pp. 2038–2044 (Apr. 11, 1979).

The connector species 16 comprises a material that displays a significant, or measurable, hysteresis in its current-voltage curve, obtained either from solution electrochemistry or from current-voltage characteristics in a solid-state junction. Examples of such species disclosed in above-referenced application Ser. No. 09/280,048 include metalocenes, rotaxanes, pseudo-rotaxanes, and catenanes, which rely on intramolecular hydrogen bonding. While such molecules are useful for the purpose disclosed, however, simple intramolecular hydrogen bonding forces are relatively easily exceeded under certain conditions, as discussed above.

Present Invention

In accordance with the present invention, a method of configuring nanometer-scale electronic switches assembled in a cross-bar circuit is provided. These circuits have been described in a series of previous patent applications, to which the present application is related, and listed above (Ser. Nos. 09/280,225; 09/280,188; 09/280,189; 09/282,045; 09/282,049; and 09/282,048).

The present invention provides a method by which the ensemble of molecular switches at a junction of a crossbar may be configured in a prescribed way. In one case, a substitution reaction causes the configuration to be substantially permanent; in another case, multiple dipoles make the switch more "sticky" so that it will not switch back. In either case, the configuration is not subject to being switched back and forth by thermal fluctuations.

The principal possibility of increased binding through the use of multiple sites on the molecule has been demonstrated; see, e.g., "Stronger binding through 'co-operativity'", *Chemical & Engineering News*, p. 57 (May 8, 2000). In contrast with the situation described in the literature, the method of the present invention utilizes molecules that are reconfigurable but does not use the extra chemical elements weakly bonded to the base of the molecule. In one case, a replacement chemical reaction is used to increase binding, and in the other case, the special design of the molecular structure is used to take advantage of the multiple hydrogen bonding.

In particular, the teachings of the present invention provide two schemes for forming stable switches.

In the first scheme, molecular switchable devices, based on hydrogen bonding, are configured in the cross-bar geometry. An external bias voltage is applied at selected nodes of the cross-bar system, and, while the field is applied, a chemical reaction is performed that replaces the hydrogen bond with either a positively charged group or with a negatively charged group, thereby essentially locking the switch at that node substantially permanently into one configuration.

In the second scheme, a molecule is synthesized having a plurality of hydrogen bonding sites that are adjacent each other. Such a configuration requires more energy to switch than a single hydrogen bonding site. The molecule will not switch back at room temperature unless an opposite polarity electric field is applied.

Both schemes are discussed in greater detail below, with examples provided to illustrate their operation. In both instances, a more stable switch is achieved in that more energy is required to switch the device out of its chosen state than is required for the more common bi-stable molecules that are based on single hydrogen bonding.

Chemical Replacement Reaction in the Presence of an Applied Field

The present invention allows configuring the molecular switch devices while the conformational change of the molecules is controlled by weak intramolecular forces (e.g., hydrogen bonding). This is done by applying an external bias voltage across the desired switch by choosing the appropriate nodes in a crossbar. While the bistable molecules are subject to an external field, thermal switching to a wrong position is energetically prohibited. At that instant, a chemical reaction is initiated which replaces the hydrogen H by a strong positively charged group, denoted $Z^+$, such as $NH_2$, divalent metal (Met), and the like, or by a strong negatively charged group, such as fluorine or chlorine.

For example, Compound 1(a) below is an example of a molecule having a dipole group. In the method of the present invention, this compound is first formed, or deposited, at the junctions of the cross-bar device. An external bias is applied to selected junctions, and during application of the field, Compound 1(a) is reacted with a negatively charged group, such as fluorine (or chlorine), to place the group in the 4-position on the acridone ring system, as shown as Compound 1(b). The F group then forms an associative bond to the nitrogen of the $NH_2$ group; this bond is stronger than a hydrogen bond, specifically, at least three time stronger.

Alternatively, during application of the external field, Compound 1(a) is reacted with a positively charged group, denoted $Z^+$ (e.g., $NH_2$ or divalent metal Met), to place the group in the 5-position on the acridone ring system, as shown as Compound 1(c). In this case, the $Z^+$ group then forms an associative bond to the carbonyl oxygen. Again, this bond is at least three times stronger than a hydrogen bond.

Again alternatively, during application of the external field, Compound 1(a) is reacted with sulfur, which places S in the 5-position on the acridone ring system, as shown as Compound 1(d). In this case, S forms a covalent bond with the carbonyl oxygen; the covalent bond is stronger than a hydrogen bond.

Any of the foregoing reactions can be performed in the presence of a catalyst or some other suitable agent. The method of the present invention is very general and will allow a configuring of arbitrary molecular devices with practically indefinite lifetime (>10 years at room temperature).

Summarizing the foregoing, the active (dipole) group in the molecule is stabilized by replacing the H site in the original molecule such as Compound 1(a) by fluorine, as shown in Compound 1(b), or by $NH_2$ or (divalent) metal, as shown in Compound 1(c). However, the associative bonds used in Compounds 1(b) (N . . . F) and 1(c) ($Z^+$ . . . N), though stronger than hydrogen bonding, still permit switching back to the other state, but require stronger fields compared to the case of a single hydrogen bond.

In the case of Compound 1(d), the weak hydrogen bond is replaced by a strong ionic bond. In the case where the hydrogen atom is replaced by sulfur, a strong covalent bond O—S is formed (~2 eV). Once the external field is turned off at that junction, the bi-stable molecule is "locked" in the configuration provided, and is stable against at least moderate increases in temperature or spurious electric fields.

Reactions of Compound 1(a) to form 1(b)-1(d)

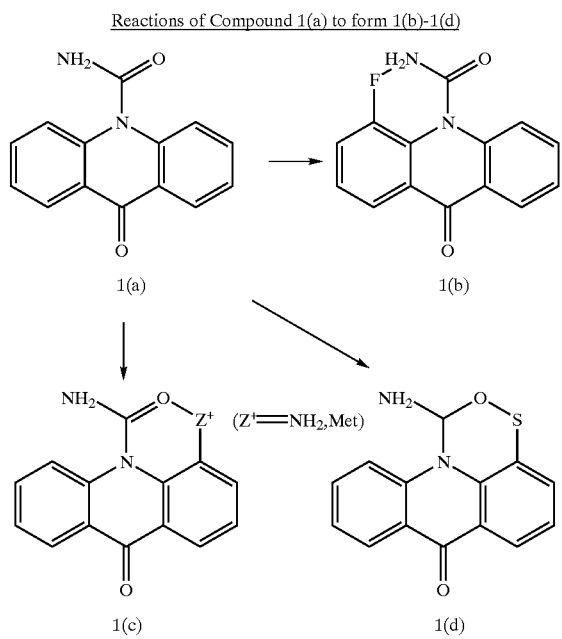

Formula (I) below represents a switchable molecule with a single active (switchable) dipole group, kept in the particular configuration by hydrogen bonding to sites E or D (replacement reactions 1 above).

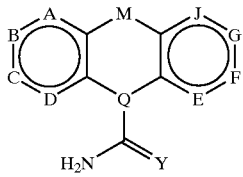

where the letters in formula (I) mean any of the following:

A=CH; N; C-alkyl; C-halogen; C-OH; C-OR(ether); C-SR (thioether); C-amide; C-ester or thioester;
B=CH; N; C-alkyl; C-halogen;; C-OH; C-OR(ether); C-SR (thioether); C-amide; C-ester or thioester;
C=CH; N; C-alkyl; C-halogen; C-OH; C-OR(ether); C-SR (thioether); C-amide; C-ester or thioester;
D=CH; N; C-alkyl; C-halogen; C-OH; C-OR(ether); C-SR (thioether); C-amide; C-ester or thioester;
E=CH; N; C-alkyl; C-halogen; C-OH; C-OR(ether); C-SR (thioether); C-amide; C-ester or thioester;
F=CH; N; C-alkyl; C-halogen; C-OH; C-OR(ether); C-SR (thioether); C-amide; C-ester or thioester;
G=CH; N; C-alkyl; C-halogen; C-OH; C-OR(ether); C-SR (thioether); C-amide; C-ester or thioester;
J=CH; N; C-alkyl; C-halogen; C-OH; C-OR(ether); C-SR (thioether); C-amide; C-ester or thioester;
M=$CH_2$; $CF_2$; $CCl_2$; $CHOCH_3$; CHOH; CHF; CO; CH=CH; $CH_2$—$CH_2$; S; O; NH; NR; NCOR; NCOAr;
Q=CH; nitrogen; phosphorus; boron; and
Y=O; S.

Substituted Molecules for Multiple Hydrogen Bonding

The following reactions 2–5 are a few examples of multiple enhanced hydrogen bonding to stabilize the (bistable) position of the centered pinwheel dipole. Reactions 2 and 3 demonstrate how intra-molecular hydrogen bonding of the multiple urea or amide group can increase the hydrogen bonding energy ($E = nE_{(N-H \ldots O=C)} + mE_{(C-H \ldots O=C)}$) by about 12 to 18 Kcal/mol (or 0.5 to 0.8 eV). This will approximately quadruple the barrier for rotating the central dipole, since it would involve now the breaking of the hydrogen bonds with two side dipole groups O-$NH_2$. It will be noted that this will enhance the stability of centrally located urea dipole to about 3 to 4 times more stable than the case without side dipolar groups; without the help of both side extra two dipoles, its hydrogen bonding energy E is about 5 Kcal/mole or 0.2 eV.

The reaction scheme below (reaction 2) depicts a first multiple stabilized dipole, based on the presence of a plurality (shown here, three) urea functional groups.

Reaction 2

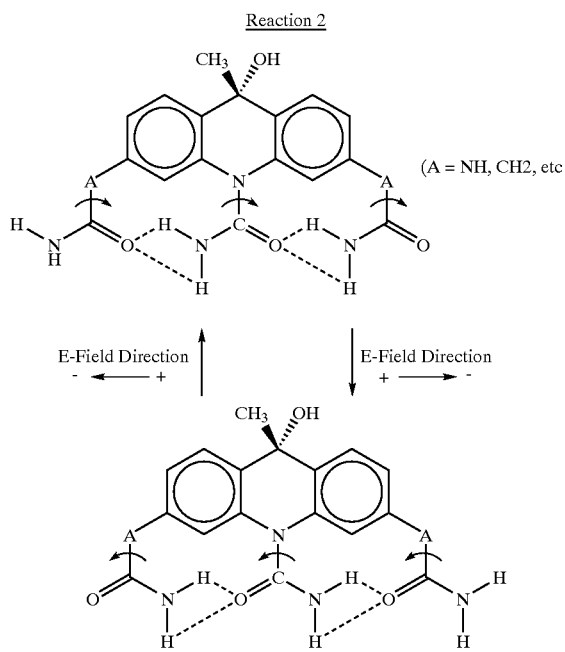

The reaction scheme below (reaction 3) depicts a second multiple stabilized dipole, based on the presence of a plurality (shown here, three) amide functional groups.

Reaction 3
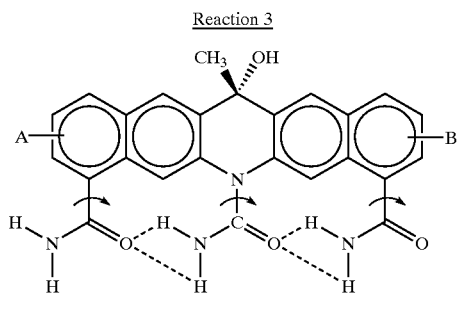
Reaction 5
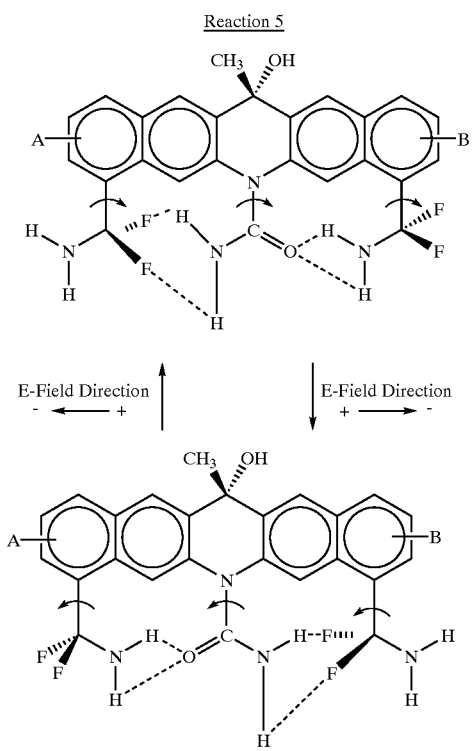
The following reactions (reactions 4, 5, and 6) are examples of making use of the N—H . . . F bond to increase the hydrogen bonding energy E.
Reaction 4
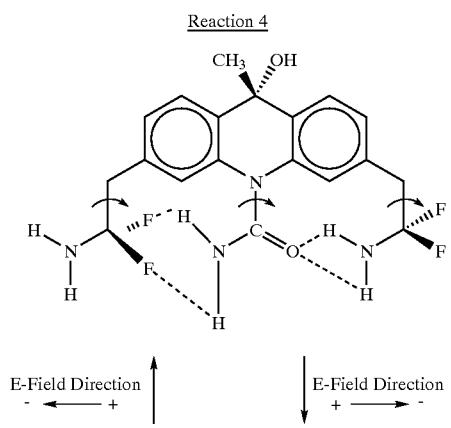
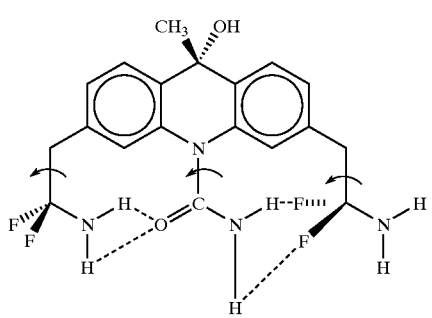
Reaction 6
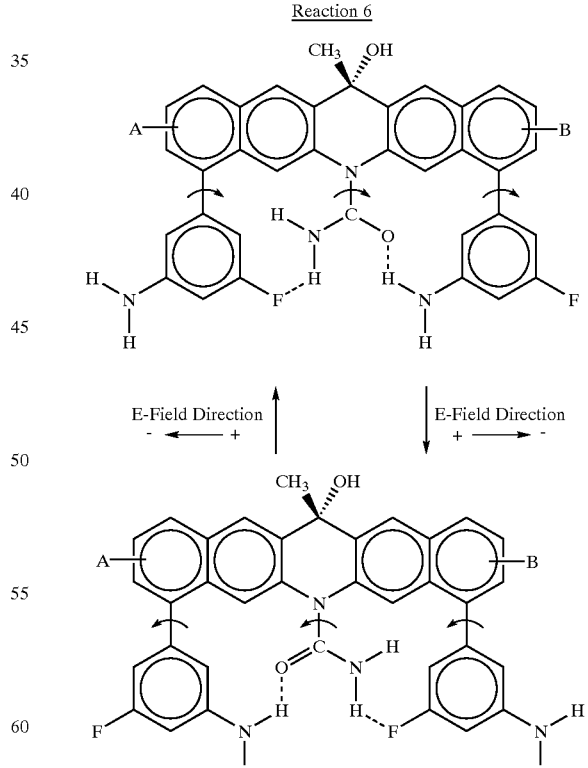
Formula (II) below represents a switchable molecule with a multiply coupled active (switchable) dipole group in the middle of the molecule stabilized by multiple hydrogen bonding to switchable groups place on the side of the central dipole group (multiple hydrogen bonding reactions 2–6 above):

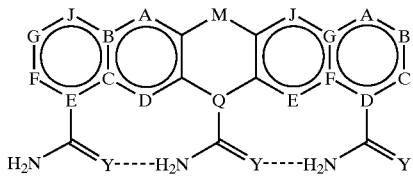

(II)

where the letters in formula (II) mean any of the following:

A=CH; N; C-alkyl; C-halogen; C-OH; C-OR(ether); C-SR (thioether); C-amide; C-ester or thioester;
B=CH; N; C-alkyl; C-halogen;; C-OH; C-OR(ether); C-SR (thioether); C-amide; C-ester or thioester;
C=CH; N; C-alkyl; C-halogen; C-OH; C-OR(ether); C-SR (thioether); C-amide; C-ester or thioester;
D=CH; N; C-alkyl; C-halogen; C-OH; C-OR(ether); C-SR (thioether); C-amide; C-ester or thioester;
E=CH; N; C-alkyl; C-halogen; C-OH; C-OR(ether); C-SR (thioether); C-amide; C-ester or thioester;
F=CH; N; C-alkyl; C-halogen; C-OH; C-OR(ether); C-SR (thioether); C-amide; C-ester or thioester;
G=CH; N; C-alkyl; C-halogen; C-OH; C-OR(ether); C-SR (thioether); C-amide; C-ester or thioester;
J=CH; N; C-alkyl; C-halogen; C-OH; C-OR(ether); C-SR (thioether); C-amide; C-ester or thioester;
M=$CH_2$; $CF_2$; $CCl_2$; $CHOCH_3$; CHOH; CHF; CO; CH=CH; $CH_2$—$CH_2$; S; O; NH; NR; NCOR; NCOAr;
Q=CH; nitrogen; phosphorus; boron; and
Y=O; S.

The technology disclosed and claimed herein for forming crossed wires (micrometer or nanometer) may be used to perform a variety of functions and to form a variety of useful devices and circuits for implementing computing on a microscale and even on a nanoscale. Molecular wire crossbar interconnects (MWCI) for signal routing and communications are disclosed and claimed in related application Ser. No. 09/280,255; molecular wire crossbar memory is disclosed and claimed in related application Ser. No. 09/280, 189; molecular wire crossbar logic (MWCL) employing programmable logic arrays is disclosed and claimed in related application Ser. No. 09/282,045; a demultiplexer for a MWC network is disclosed and claimed in related application Ser. No. 09/282,049; and molecular wire transistors are disclosed and claimed in related application Ser. No. 09/280,188, all filed on Mar. 29, 1999.

Figure 2:
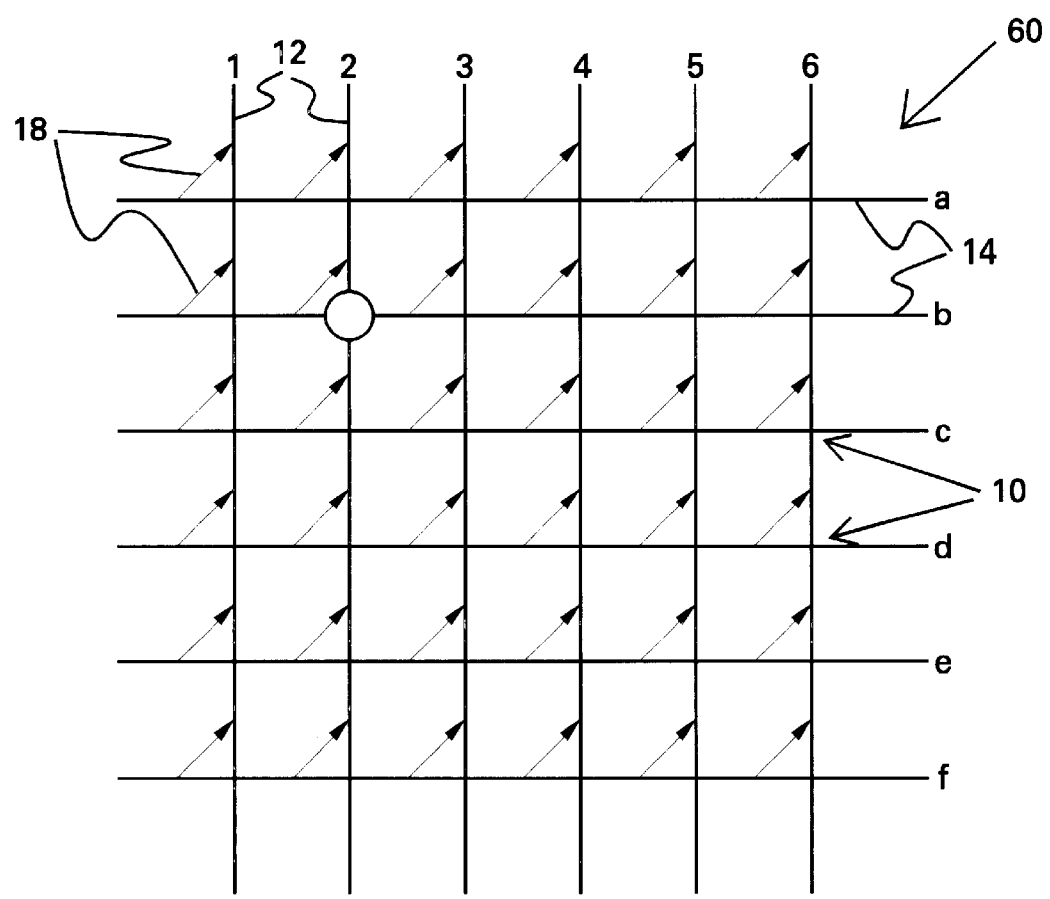
FIG. 2 is a schematic representation of a two-dimensional array of switches of the present invention, depicting a 6×6 crossbar switch.

As illustrated in FIG. 2, the switch 10 of the present can be replicated in a two-dimensional array to form a plurality, or array, 60 of switches to form a crossbar switch. FIG. 2 depicts a 6×6 array 60, but the invention is not so limited to the particular number of elements, or switches, in the array. Access to a single point, e.g., 2b, is done by impressing voltage on wires 2 and b to cause a change in the state of the molecular species 18 at the junction thereof, as described above. Thus, access to each junction is readily available for configuring only those pre-selected junctions in accordance with the teachings herein. Details of the operation of the crossbar switch array 60 are further discussed in related application Ser. No. 09/280,225.

Thus, there has been disclosed chemically synthesized and assembled electronic devices comprising crossed wires joined by electrochemically switchable molecular species at the intersecting junctions. It will be apparent to those skilled in this art that various changes and modifications of an obvious nature may be made, and all such changes and modifications are considered to fall within the scope of the appended claims.

What is claimed is:

1. A method of configuring an ensemble of molecular switches in a prescribed manner in crossbar geometry and then making such configuration either substantially permanent or stable with regard to temperature fluctuations, comprising the steps of:

(a) providing said ensemble of molecular switches in said crossbar geometry, each said molecular switch comprising a pair of crossed wires that form a junction where one wire crosses another at an angle other than zero degrees;

(b) providing said junction with at least one connector species connecting said pair of crossed wires in said junction, said junction having a functional dimension in a range from nanometers to micrometers, wherein said at least one connector species and said pair of crossed wires forms an electrochemical cell, said connector species comprising a molecule having at least one active dipole; and (c) either substantially permanently configuring said connector species where said connector species has one active dipole or stably configuring said connector species where said connector species has more than one active dipole.

2. The method of claim 1 wherein said configuration is made substantially permanent by forming a single bond within said connector species that is at least three times stronger than a hydrogen bond.

3. The method of claim 2 wherein said connector species is substantially permanently configured by the following steps:

(a) forming said connector species in said junction;

(b) applying an external electric field to said junction to configure said connector species;

(c) replacing a hydrogen atom with a species that forms a bond with a portion of said dipole that is stronger than said hydrogen bond; and (d) removing said electric field, leaving said switch substantially permanently in said configuration.

4. The method of claim 3 wherein said hydrogen atom is replaced by a member selected from the group consisting of fluorine, chlorine, $NH_2$, divalent metal, and sulfur.

5. The method of claim 4 wherein said connector species remains switchable by employing associative bonds selected from the group consisting of F N, Cl, N, $NH_2$ . . . N, and (Met) . . . N, where (Met) is said divalent metal, said connector species being switchable upon exposure to an electric field having a strength greater than said hydrogen bond.

6. The method of claim 4 wherein said connector species is made permanently configured by forming a covalent bond between said sulfur and oxygen.

7. The method of claim 2 wherein said connector species has a formula given by

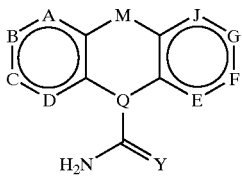

(I)

where the letters in formula (I) mean any of the following:
A=CH; N; C-alkyl; C-halogen; C-OH; C-OR(ether); C-SR(thioether); C-amide; C-ester or thioester;
B=CH; N; C-alkyl; C-halogen; C-OH; C-OR(ether); C-SR(thioether); C-amide; C-ester or thioester;
C=CH; N; C-alkyl; C-halogen; C-OH; C-OR(ether); C-SR(thioether); C-amide; C-ester or thioester;
D=CH; N; C-alkyl; C-halogen; C-OH; C-OR(ether); C-SR(thioether); C-amide; C-ester or thioester;
E=CH; N; C-alkyl; C-halogen; C-OH; C-OR(ether); C-SR(thioether); C-amide; C-ester or thioester;
F=CH; N; C-alkyl; C-halogen; C-OH; C-OR(ether); C-SR(thioether); C-amide; C-ester or thioester;
G=CH; N; C-alkyl; C-halogen; C-OH; C-OR(ether); C-SR(thioether); C-amide; C-ester or thioester;
J=CH; N; C-alkyl; C-halogen; C-OH; C-OR(ether); C-SR(thioether); C-amide; C-ester or thioester;
M=$CH_2$; $CF_2$; $CCl_2$; $CHOCH_3$; CHOH; CHF; CO; CH=CH; $CH_2$—$CH_2$; S; O; NH; NR; NCOR; NCOAr;
Q=CH; nitrogen; phosphorus; boron; and
Y=O; S.

8. The method of claim 1 wherein said configuration is made stable by forming a plurality of hydrogen bonds within said connector species.

9. The method of claim 8 wherein said connector species is stabilized in one of two stable states by the following steps:
(a) providing said plurality of dipole groups on said connector species, each capable of hydrogen bonding with an adjacent dipole group on said connector species;
(b) forming said connector species in said junction;
(c) applying an external electric field to said junction to configure said connector species; and
(d) removing said electric field, leaving said switch in said stabilized configuration.

10. The method of claim 9 wherein said dipole groups comprise urea or amide functional groups.

11. The method of claim 10 wherein said dipole groups employ N—H . . . F bonds to increase hydrogen bonding energy.

12. The method of claim 8 wherein said connector species has a formula given by

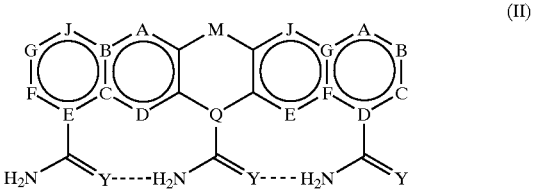

(II)

where the letters in formula (II) mean any of the following:
A=CH; N; C-alkyl; C-halogen; C-OH; C-OR(ether); C-SR(thioether); C-amide; C-ester or thioester;
B=CH; N; C-alkyl; C-halogen;; C-OH; C-OR(ether); C-SR(thioether); C-amide; C-ester or thioester;
C=CH; N; C-alkyl; C-halogen; C-OH; C-OR(ether); C-SR(thioether); C-amide; C-ester or thioester;
D=CH; N; C-alkyl; C-halogen; C-OH; C-OR(ether); C-SR(thioether); C-amide; C-ester or thioester;
E=CH; N; C-alkyl; C-halogen; C-OH; C-OR(ether); C-SR(thioether); C-amide; C-ester or thioester;
F=CH; N; C-alkyl; C-halogen; C-OH; C-OR(ether); C-SR(thioether); C-amide; C-ester or thioester;
G=CH; N; C-alkyl; C-halogen; C-OH; C-OR(ether); C-SR(thioether); C-amide; C-ester or thioester;
J=CH; N; C-alkyl; C-halogen; C-OH; C-OR(ether); C-SR(thioether); C-amide; C-ester or thioester;
M=$CH_2$; $CF_2$; $CCl_2$; $CHOCH_3$; CHOH; CHF; CO; CH=CH; $CH_2$—$CH_2$; S; O; NH; NR; NCOR; NCOAr;
Q=CH; nitrogen; phophorus; boron; and
Y=O; S.

* * * * *